United States Patent [19]

Haque

[11] Patent Number: 4,540,949
[45] Date of Patent: Sep. 10, 1985

[54] REFERENCE VOLTAGE CIRCUIT INCLUDING A THREE-TERMINAL OPERATIONAL AMPLIFIER WITH OFFSET COMPENSATION

[75] Inventor: Yusuf A. Haque, San Jose, Calif.

[73] Assignee: American Microsystems, Inc., Santa Clara, Calif.

[21] Appl. No.: 584,655

[22] Filed: May 2, 1984

Related U.S. Application Data

[62] Division of Ser. No. 292,968, Aug. 14, 1981, Pat. No. 4,460,874.

[51] Int. Cl.³ .......................... H03F 1/36; H03F 1/02
[52] U.S. Cl. .......................................... 330/85; 330/9
[58] Field of Search .................. 330/9, 149, 253, 261, 330/51, 296, 85

[56] References Cited

U.S. PATENT DOCUMENTS 4,229,703  10/1980  Bustin ..................................... 330/9

*Primary Examiner*—James B. Mullins
*Assistant Examiner*—G. Wan
*Attorney, Agent, or Firm*—Steven F. Caserza; Alan H. MacPherson; Thomas S. MacDonald

[57] ABSTRACT

An operational amplifier has one noninverting input lead (116), and two inverting input leads (117a, 117b). One of these inverting input leads (117a) is utilized to compensate for the effects of the inherent offset voltage ($V_{off}$) of the operational amplifier, and the second inverting input lead (117b) receives an input signal to be amplified or compared.

4 Claims, 3 Drawing Figures

REFERENCE VOLTAGE CIRCUIT INCLUDING A THREE-TERMINAL OPERATIONAL AMPLIFIER WITH OFFSET COMPENSATION

This application is a division of application Ser. No. 292,968, filed Aug. 14, 1981, now U.S. Pat. No. 4,460,874.

BACKGROUND OF THE INVENTION

1. Field of the Invention

This invention relates to operational amplifiers, and more specifically to a unique operational amplifier having three input terminals, allowing for cancellation of the inherent offset voltage of the operational amplifier while providing an inverting and a noninverting input lead for receiving two non-sampled input signals.

2. Description of the Prior Art

Prior art operational amplifiers are well-known. In the manufacture of operational amplifiers in the form of integrated circuits, fabrication tolerances result in component mismatches, thus providing each operational amplifier with its own unique inherent offset voltage $V_{off}$. This offset voltage is defined as the output voltage of the operational amplifier when the amplifier is in the unity gain mode (inverting input lead and output lead connected) and its noninverting input lead grounded. Because each operational amplifier has its own unique offset voltage, each circuit utilizing such an operational amplifier must compensate in a unique manner for the inherent offset voltage associated with that specific operational amplifier.

Several prior art methods of providing compensation for the inherent offset voltage of an operational amplifier are known. However, such methods require that the offset voltage be stored on an offset capacitor connected to the inverting input lead of the operational amplifier, thus preventing the inverting input lead from being utilized as an input lead for receiving a continuous, non-sampled input signal. Such prior art methods allow the inverting input lead to be utilized for receiving an input signal only if the input signal is sampled and stored on an input capacitor, and the input capacitor is then connected to the inverting input lead of the operational amplifier. In this manner, the offset voltage stored on the offset capacitor is prevented from being discharged. Such a method and structure are disclosed in my copending U.S. patent application Ser. No. 185,356 filed Sept. 8, 1980 and assigned to American Microsystems, Inc., the assignee of this application, which is hereby incorporated by reference.

SUMMARY

In accordance with this invention a unique configuration of an operational amplifier circuit is provided. The operational amplifier constructed in accordance with this invention has three or more input leads, rather than the two input leads of prior art devices. One embodiment of this invention has one noninverting input lead and two inverting input leads. One of these inverting input leads is utilized in compensating for the effects of the inherent offset voltage of the operational amplifier, and the second inverting input lead is utilized for receiving a non-sampled input signal. In contrast to the requirements of prior art circuits, this input signal is not required to be sampled and stored on a capacitor prior to being input to the operational amplifier.

DETAILED DESCRIPTION

Figure 1:
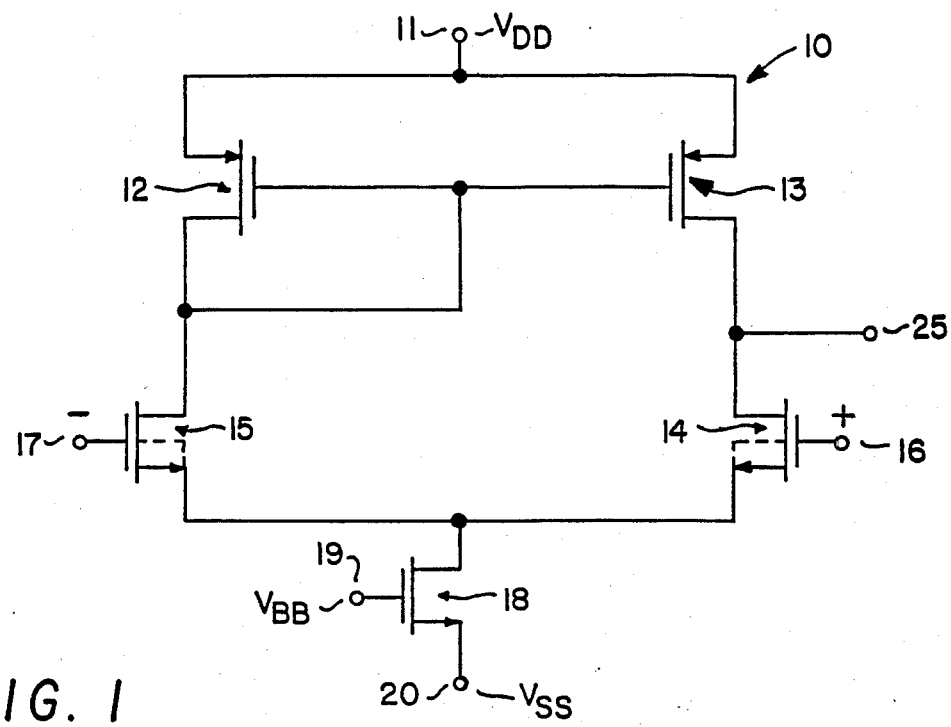
FIG. 1 is a schematic diagram of a typical prior art operational amplifier.

FIG. 1 is a schematic diagram of a typical prior art operational amplifier differential input stage 10 utilizing N channel MOS transistors. MOS transistor 18 is utilized as a constant current source, with its gate lead 19 connected to a bias voltage $V_{BB}$. Source lead 20 of transistor 18 is connected to a negative supply voltage $V_{SS}$. Lead 11 of operational amplifier 10 is connected to a positive supply voltage $V_{DD}$. MOS transistors 12 and 13 act as loads in the inverting input leg and the noninverting input leg of operational amplifier differential input stage 10, respectively. MOS transistor 14 serves as the noninverting input transistor, having its gate lead 16 acting as the noninverting input lead of operational amplifier differential input stage 10. Similarly, MOS transistor 15 serves as the inverting input transistor, with its gate lead 17 acting as the inverting input lead of operational amplifier differential input stage 10. Lead 25 supplies an output voltage to an inverting output stage (not shown) of the operational amplifier. When the voltage applied to noninverting input lead 16 is positive with respect to the voltage applied to inverting input lead 17, an increased amount of the limited current available from constant current source 18 flows through transistor 14 of the noninverting leg of operational amplifier 10. This decreases the amount of current flowing through transistor 15 in the inverting leg of operational amplifier 10. Thus, the output voltage available on lead 25 decreases. Conversely, when the voltage applied to noninverting input lead 16 is negative with respect to the voltage applied to inverting input lead 17, the current flowing through transistor 14 is decreased, with a resultant increase in the current flowing through transistor 15, thus increasing the voltage available on lead 25. Lead 25 is commonly connected to a buffer stage, or an output stage capable of providing relatively high gain and high output currents.

Figure 2:
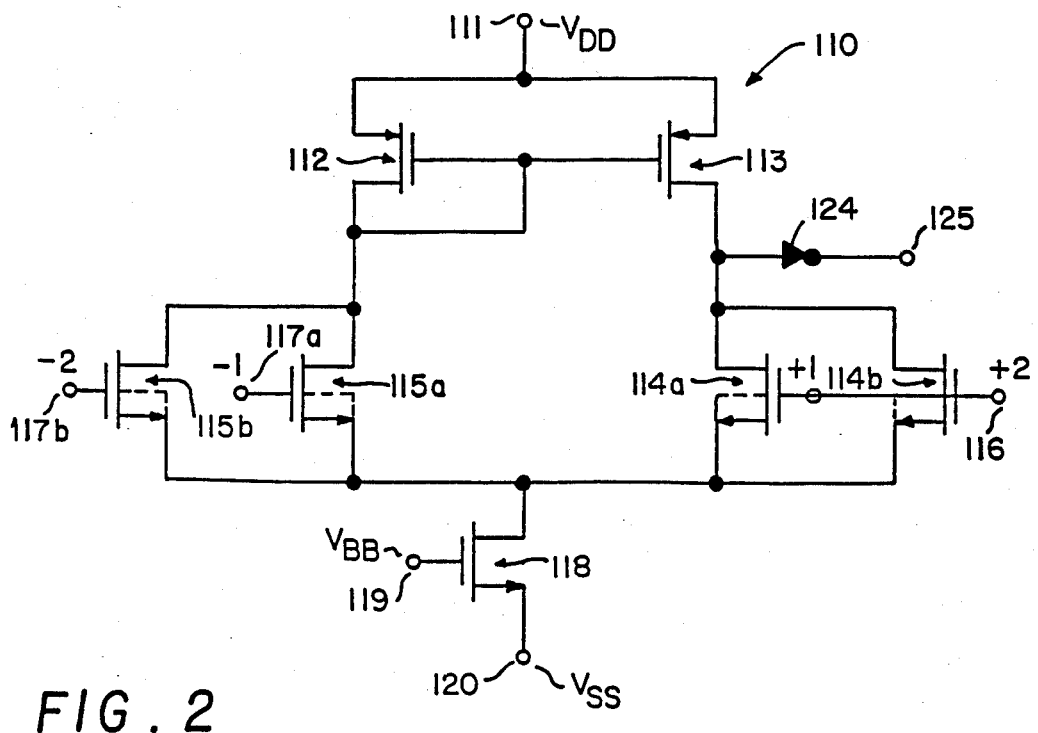
FIG. 2 is a schematic diagram of the operational amplifier of this invention.

As described in the co-pending U.S. patent application cited above, prior art operational amplifiers utilizing offset compensation means possess an inverting input lead not capable of being used to receive a non-sampled input voltage. In accordance with this invention, an operational amplifier differential input stage is shown in the schematic diagram of FIG. 2 which overcomes this problem of prior art circuits by providing two inverting input leads. The noninverting input leg of operational amplifier differential input stage 110 comprises transistor 113, serving as a load, and transistors 114a and 114b, serving as noninverting input transistors, whose gates each serve as a noninverting input lead and which, in the embodiment shown in FIG. 2, are connected in common to noninverting input lead 116. The invention input leg of operational amplifier 110 comprises transistor 112, serving as a load, and inverting input transistor 115a, whose gate lead 117a serves as a first inverting input lead (−1), and transistor 115b, whose gate lead 117b serves as a second inverting input lead (−2). Transistor 118 serves as a constant current source, with its gate lead 119 connected to bias voltage $V_{BB}$, and its source lead 120 connected to a negative voltage supply $V_{SS}$. Lead 111 is connected to a positive voltage supply $V_{DD}$ as shown.

In order to minimize the inherent offset voltage of the operational amplifier, the threshold voltage and current/voltage characteristics of transistors 114a and 114b of the noninverting leg are preferably closely matched to the threshold voltage and the current/voltage characteristics of inverting input transistors 115a and 115b. As is well known, the threshold voltage and the current/voltage characteristics of MOS transistors are dependent on dopant levels and types, and the physical dimensions of the MOS transistors such as channel length and width and gate dielectric thickness. By careful control of the dimensions of the masks used to fabricate the operational amplifier in integrated circuit form and equally careful control of the fabrication processes, the transistors 114a, 114b, 115a and 115b can be fabricated to be substantially matched and balanced. Of course, transistors 114a and 114b may be formed as a single transistor having characteristics closely matched to the characteristics of the combination of transistors 115a and 115b but generally these transistors are more easily formed as a pair.

The operation of the circuit of FIG. 2 is as follows. The offset voltage, $V_{off}$, of the operational amplifier 110 is obtained, and provided to inverting input lead 117b. The offset voltage may be obtained by placing the operational amplifier 110 in the unity gain mode by connecting inverting input lead 117b to output lead 125, and connecting inverting input lead 117a to noninverting input lead 116. The result will be the offset voltage, $V_{off}$, of operational amplifier 110 being present on output lead 125. This offset voltage may then be stored in a sample and hold circuit of well known design, or simply stored on a storage capacitor, as described in the aforementioned U.S. patent application Ser. No. 185,356. When the operational amplifier 110 is taken out of the unity gain mode of operation, the offset voltage obtained in this manner is permanently applied to inverting input lead 117b.

In operation, the offset voltage $V_{off}$ applied to inverting input lead 117b provides a constant bias to transistor 115b, thus providing a relatively constant current flow through transistor 115b. This current flow through the inverting input leg provides compensation for the inherent component mismatches of operational amplifier 110 which cause the offset voltage $V_{off}$ in the first place. In this manner, when the input voltages applied to inverting input lead 117a and noninverting input lead 116 are exactly equal, the sum of the currents through transistor 115a, and transistor 115b (due to the application of $V_{off}$ on lead 117b) will exactly equal the sum of the currents flowing through transistors 114a and 114b, thus providing an output voltage on output lead 125 which is compensated for the effects of the inherent offset voltage $V_{off}$ of the operational amplifier. Similarly, during periods of operation when the input voltages applied to inverting input lead 117a and noninverting input lead 116 are not equal, the current flow through transistor 115b due to the application of $V_{off}$ on inverting input lead 117b will provide compensation for the inherent component mismatches of operational amplifier 110, thus providing an output voltage on output lead 125 which is the effects of the inherent offset voltage of operational amplifier 110.

An operational amplifier may be constructed in accordance with this invention having a plurality of inverting input leads and a plurality of noninverting input leads. When the operational amplifier is operating such that its output voltage is not saturated, the output voltage of the operational amplifier of this invention will be:

$$V_{out} \alpha \sum_{i=1}^{j} V_{noni} - \sum_{i=1}^{k} V_{invi} + V_{off},$$

where:

| | |
|---|---|
| $V_{out} =$ | the output voltage of the operational amplifier; |
| $j =$ | the number of noninverting input leads of the operational amplifier; |
| $k =$ | the number of inverting input leads of the operational amplifier; and |
| $V_{noni} =$ | the input voltage applied to the ith noninverting input lead of the operational amplifier; |
| $V_{invi} =$ | the input voltage applied to the ith inverting input lead of the operational amplifier; |
| $V_{off} =$ | the inherent offset voltage of the operational amplifier. |

Figure 3:
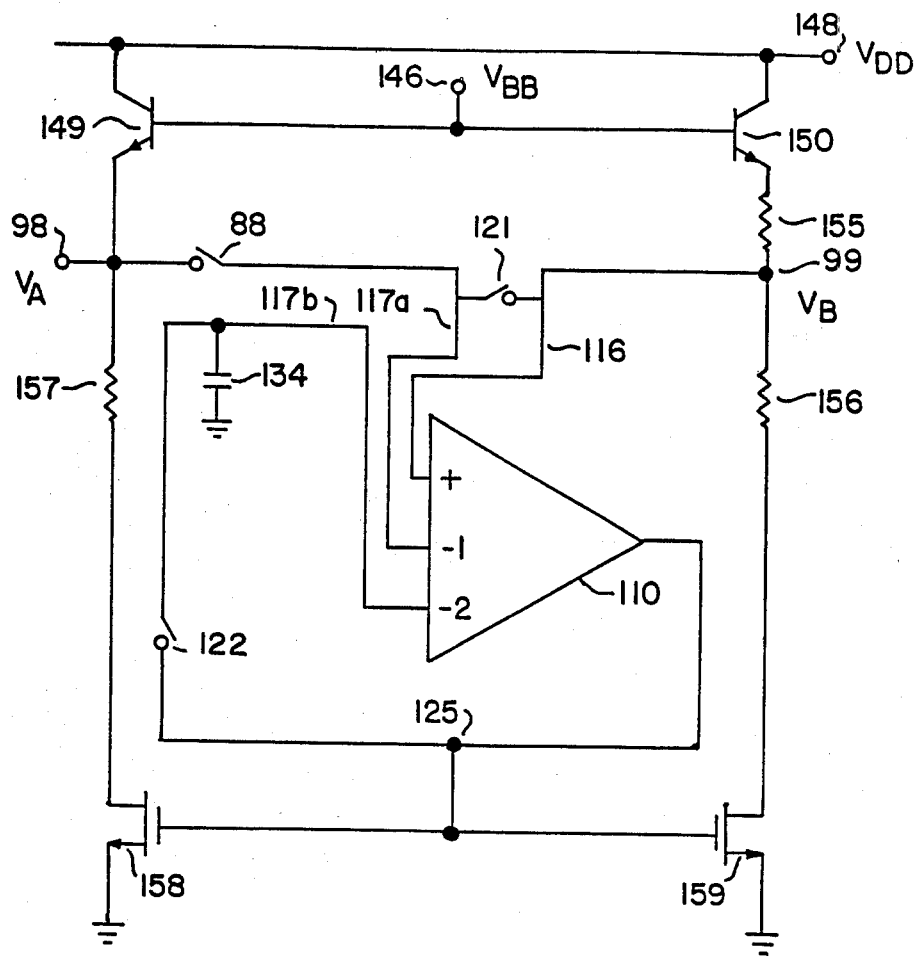
FIG. 3 is a schematic diagram showing one use of the operational amplifier of this invention in a voltage reference circuit.

As one example of the use of this invention, a voltage reference circuit utilizing the operational amplifier of this invention is shown in FIG. 3. A prior art voltage reference circuit utilizing a prior art, two input terminal operational amplifier in a configuration similar to the circuit shown in FIG. 3 is described by Bingham, "CMOS: Higher speeds, more drive and analog capability expand its horizons", Electronic Design 23, Nov. 8, 1978, which is hereby incorporated by reference and in particular Bingham's FIG. 7 on page 81. Unlike the voltage reference circuit of FIG. 3, which comprises the unique three input terminal operational amplifier of this invention, the Bingham circuit does not provide a means for eliminating the effects of the inherent offset voltage of the operational amplifier.

Referring to FIG. 3, operational amplifier 110 comprises noninverting input lead 116 and inverting input lead 117a for receiving nonsampled input voltages, and inverting input lead 117b for the purpose of eliminating the effects of the inherent offset voltage of operational amplifier 110. In operation, first switches 121 and 122 are closed, and switch 88 opened. This places the operational amplifier 110 in the unity gain mode with the differential voltage between leads 116 and 117a equal to zero (i.e. both leads 116 and 117a are connected to node 99, which has a potential of $V_B$) and inverting input lead 117b connected to output node 125, thus forcing the voltage on node 125 to $V_B + V_{off}$, where $V_{off}$ is the inherent offset voltage of operational amplifier 110. A charge sufficient to produce the voltage $V_B + V_{off}$ is thus stored on capacitor 134 connected between inverting input lead 117b and ground. Switches 121 and 122 are then opened, and switch 88 closed. This allows voltage $V_B$ available on node 99 to be connected to noninverting input lead 116, voltage $V_A$ available on node 98 to be connected to inverting input lead 117a, and voltage stored on capacitor 134 ($V_B + V_{off}$) to be applied to inverting input lead 117b.

Lead 148 is connected to a positive supply voltage $V_{DD}$. Transistors 149 and 150 act as constant current sources, with their collectors connected to $V_{DD}$ and their bases connected to a bias voltage $V_{BB}$ applied to lead 146. The base-emitter voltages of transistors 149 and 150 are substantially constant. Resistors 155 and 156 and MOS transistor 159 form a voltage divider providing the output reference voltage $V_B$ on node 99 located between the resistors of the voltage divider. Resistor 157 provides an impedance between transistors 149 and 158, although resistor 157 need not be used. Reference voltage $V_B$ is applied to the noninverting input lead 116 of operational amplifier 110 and reference voltage $V_A$ (from lead 98) is applied to inverting input lead 117a of operational amplifier 110. The output voltage of operational amplifier 110 is applied to the gates of transistors 158 and 159, thus providing feedback. $V_A$ remains relatively constant at $(V_{BB} - V_{BE})$, where $V_{BE}$ is the base-emitter voltage of transistor 149. If $V_A$ is greater than $V_B$, the output voltage from operational amplifier 110 is decreased thus decreasing the current flow through transistors 158 and 159, which increases the voltage on node 99 ($V_B$) toward $V_{BB}$, thus forcing $V_B$ to equal $V_A$. Similarly, if $V_A$ is less than $V_B$, the output voltage from operational amplifier 110 is increased, thus increasing the current flow through transistors 158 and 159, which decreases the voltage on node 99 ($V_B$) thus forcing $V_A$ to equal $V_B$. When $V_A$ is equal to $V_B$, the output voltage from operational amplifier 110 remains constant, thus preventing any change in the biasing of transistors 158 and 159, thus maintaining constant current flow through transistors 158 and 159, thus assuring an unchanging $V_A$ which is equal to $V_B$.

In contrast, prior art voltage reference circuits of this type utilize prior art (i.e., two input lead) operational amplifiers for feedback. Thus in prior art circuits of this type, an inverting input lead such as lead 117b, capacitor 134, and switches 88, 121, and 122 are not utilized and thus the effects of the inherent offset voltage of the operational amplifier are not eliminated, and the reference voltages stablize at $V_A = V_B + V_{off}$. In such prior art circuits, when $V_A = V_B + V_{off}$ the operational amplifier behaves as though there is no voltage differential between its inverting and noninverting inputs, thus providing a stabilized circuit. However, because $V_{off}$ is not the same magnitude in a plurality of operational amplifiers, the values of $V_A$ will vary between voltage reference circuits utilizing prior art operational amplifiers, as will the values of $V_B$. Furthermore, $V_{off}$ varies with temperature, thus in voltage reference circuits utilizing prior art operational amplifiers, $V_A$ and $V_B$ will also vary with temperature.

Thus, utilizing the operational amplifier of this invention, the inherent offset voltage of the operational amplifier may be eliminated from the output voltage and the reference voltages may be made equal in a plurality of circuits, regardless of temperature variations. The use of the operational amplifier of this invention provides free use of one noninverting input lead and one inverting input lead for receiving two nonsampled input voltages to be amplified or compared. This structure overcomes the disadvantages in prior art operational amplifiers wherein methods used to eliminate the effects of the inherent offset voltage $V_{off}$ of the operational amplifier result in the requirement that the input voltage applied to the non-inverting input lead of the operational amplifier be first sampled and stored in a capacitor. In a similar fashion, additional noninverting input leads and inverting input leads may be added to the operational amplifier of this invention, thus providing a plurality of noninverting input leads and a plurality of inverting input leads, for the reception of a plurality of voltages to be amplified or compared.

I claim:

1. A voltage reference circuit comprising:
   an input reference voltage terminal receiving an input reference voltage having a level determined by a bias voltage source;
   an output reference voltage terminal providing an output reference voltage having a level maintained equal to said input reference voltage;
   an operational amplifier having a noninverting input terminal, an output terminal and a first and a second inverting input terminal, said second inverting input terminal receiving a voltage which causes the output voltage of said operational amplifier to be zero when the voltage on said first inverting input terminal is equal to the voltage on said noninverting input terminal; and
   a voltage adjusting circuit having:
   first and second load transistors, said load transistors having first current carrying terminals connected to a positive voltage source, control terminals connected to said bias voltage source, and having second current carrying terminals, said input reference voltage terminal connected to the second current carrying terminal of said first load transistor and to said first inverting input terminal of said operational amplifier;
   voltage divider means, the divided voltage from said voltage divider means being applied to said output reference voltage terminal and to said noninverting input terminal of said operational amplifier;
   offset voltage storage means for storing the offset voltage of said operational amplifier obtained at said output terminal of said operational amplifier when the voltage on said noninverting input terminal is held equal to the voltage on said first inverting input terminal, and for providing said offset voltage to said second inverting input terminal; and
   output voltage adjusting means comprising a first output voltage adjusting transistor having its first current carrying terminal connected to the second current carrying terminal of said first load transistor and its second current carrying terminal connected to a negative voltage source, a second output voltage adjusting transistor having its first current carrying terminal connected through said voltage divider means to the second current carrying terminal of said second load transistor and its second current carrying terminal connected to said negative voltage source, said first and second output voltage adjusting transistors having their control terminals connected to the output terminal of said operational amplifier.

2. A voltage reference circuit as in claim 1 where said offset voltage storage means comprises a capacitor.

3. A voltage reference circuit as in claim 1 where said voltage divider means comprises a pair of resistors.

4. A voltage reference circuit as in claim 1 also including a load device located between said first current carrying terminal of said first output voltage adjusting transistor and said second current carrying terminal of said first load transistor.

* * * * *